(12) United States Patent
Zhang et al.

(10) Patent No.: US 11,069,765 B2
(45) Date of Patent: Jul. 20, 2021

(54) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Le Zhang, Hubei (CN); Wenjun Guo, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 81 days.

(21) Appl. No.: 16/493,589

(22) PCT Filed: Jan. 28, 2019

(86) PCT No.: PCT/CN2019/073323
§ 371 (c)(1),
(2) Date: Sep. 12, 2019

(87) PCT Pub. No.: WO2020/124743
PCT Pub. Date: Jun. 25, 2020

(65) Prior Publication Data
US 2020/0279903 A1 Sep. 3, 2020

(30) Foreign Application Priority Data
Dec. 18, 2018 (CN) .......................... 201811550307.3

(51) Int. Cl.
*H01L 27/12* (2006.01)
*H01L 51/00* (2006.01)
*H01L 27/32* (2006.01)

(52) U.S. Cl.
CPC ...... *H01L 27/3276* (2013.01); *H01L 51/0097* (2013.01); *H01L 2227/323* (2013.01); *H01L 2251/566* (2013.01)

(58) Field of Classification Search
CPC ............. H01L 27/3276; H01L 27/1222; H01L 51/5237; H01L 51/56; H01L 51/0097; H01L 2251/566; H01L 2251/5338
See application file for complete search history.

(56) References Cited

U.S. PATENT DOCUMENTS

2010/0013785 A1* 1/2010 Murai ................ G06F 3/04146
345/173
2014/0264425 A1* 9/2014 Chida ................ H01L 51/0097
257/99
(Continued)

FOREIGN PATENT DOCUMENTS

CN 202886795 U 4/2013
CN 108594506 A 9/2018
(Continued)

*Primary Examiner* — Mohsen Ahmadi (57) ABSTRACT

A display panel and a manufacturing method thereof are provided. The method includes: forming a flexible substrate on a display area and a welding area of a glass substrate; sequentially forming a switch array layer and an organic light-emitting display layer on the flexible substrate and an edge area of the glass substrate; patterning the switch array layer, such that a switching element and a metal wire are respectively formed on the display area and the welding area, and a portion of the switch array layer and the organic light-emitting display layer on the edge area are removed.

13 Claims, 5 Drawing Sheets

(56) References Cited

U.S. PATENT DOCUMENTS

| | | | |
|---|---|---|---|
| 2015/0034935 A1 | 2/2015 | Choi | |
| 2016/0111485 A1* | 4/2016 | Chida | H01L 51/0097 |
| | | | 257/40 |
| 2018/0373079 A1* | 12/2018 | Yeh | G02F 1/13338 |
| 2019/0204655 A1* | 7/2019 | Shimizu | G02F 1/133305 |
| 2019/0341567 A1 | 11/2019 | Li et al. | |

FOREIGN PATENT DOCUMENTS

| | | |
|---|---|---|
| CN | 108807480 A | 11/2018 |
| CN | 108962948 A | 12/2018 |

\* cited by examiner

FIG. 1

(PRIOR ART)

FIG. 2

(PRIOR ART)

DISPLAY PANEL AND MANUFACTURING METHOD THEREOF

FIELD OF DISCLOSURE

The present disclosure relates to the field of display technologies, and in particular, to a display panel and a manufacturing method thereof.

BACKGROUND

Figure 1:
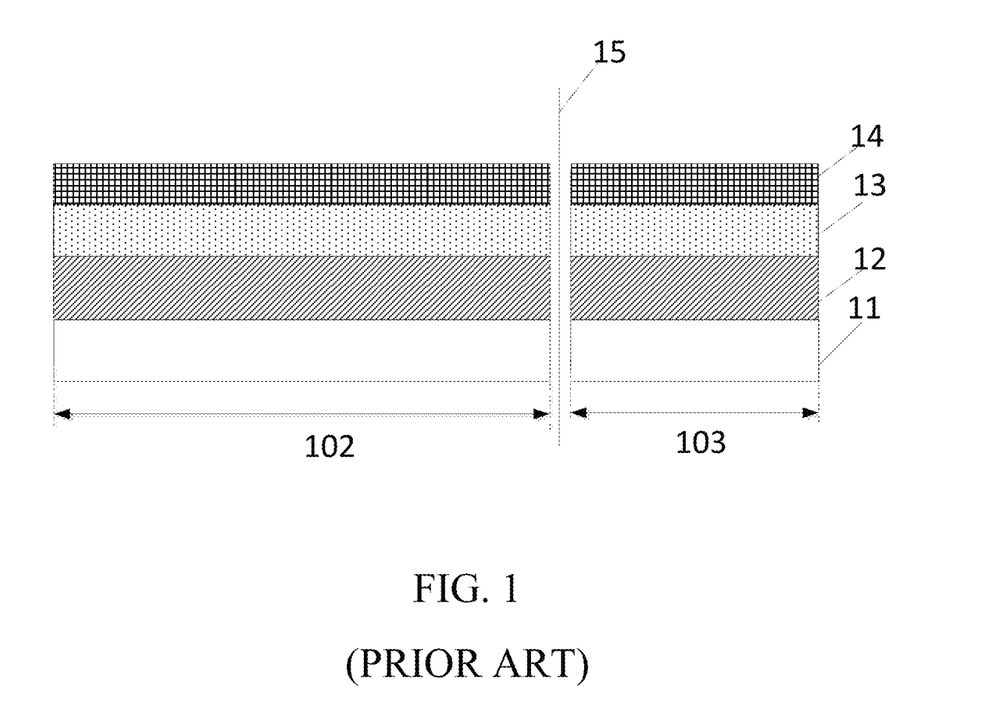
FIG. 1 is a schematic structural diagram of a manufacturing method of a display panel in the prior art.

A flexible display panel is widely used because of its advantages, such as being light in weight, thinness, flexibility, and foldability. As shown in FIG. 1, the flexible display panel is usually fabricated by forming a flexible substrate 11 on a glass substrate, and then forming a switch array layer 12, an organic light-emitting display layer 13 on the flexible substrate 11, and then forming a thin film encapsulation (TFE) layer 14. Subsequently, an edge area 103 adjacent to the outside of a welding area 102 is cut along a cutting line 15, and the flexible substrate 11 is stripped from the glass substrate to obtain the flexible display panel. Also, the flexible substrate 11 may be cut after stripping it from the glass substrate. Since the flexible substrate includes a flexible underlayer and a plastic protective film, it is not suitable for cutting by a cutter wheel, and the suitable cutting method for the flexible display panel is laser cutting.

Figure 2:
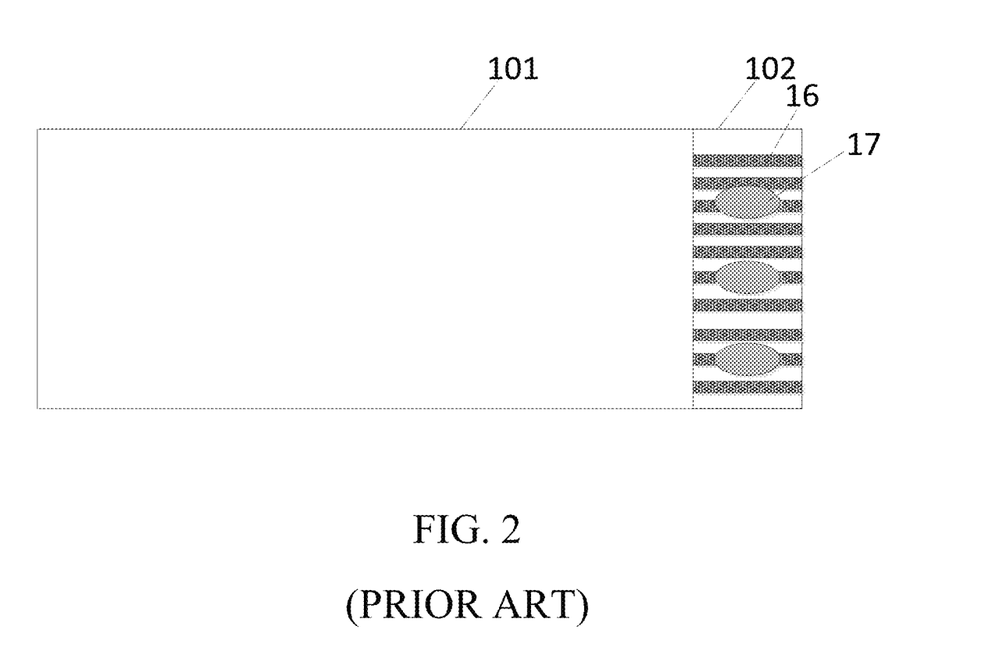
FIG. 2 is a top view of the display panel after cutting in the prior art.

As shown in FIG. 2, a reference numeral 101 in FIG. 2 represents a display area. When laser cutting, the flexible substrate near the cutting line 15 is carbonized and sputtered to the welding area 102, so as to be cooled and solidified to form conductive particles 17. An upper metal layer near the cutting line 15 also generates the conductive particles 17 to be sputtered into the welding area 102. These conductive particles 17 may cause a short circuit of a metal wire 16 during a power-on test of the display panel, thereby causing burns, abnormal images, or poor lines, etc.

Accordingly, it is necessary to provide a display panel and a manufacturing method thereof to solve the technical problem in the prior art.

SUMMARY OF DISCLOSURE

An object of the present disclosure is to provide a display panel and a manufacturing method thereof, which can increase conductivity of a thin film transistor.

In order to achieve the objects described above, the present disclosure provides a manufacturing method of a display panel, including:

forming a flexible substrate on a display area and a welding area of a glass substrate, where the glass substrate includes the display area, the welding area, and an edge area;

forming a switch array layer on the flexible substrate and the edge area of the glass substrate, and patterning the switch array layer, such that the switch array layer corresponding to the display area serves as a switching element, and the switch array layer corresponding to the welding area serves as a metal wire, and a portion of the switch array layer on the edge area is removed, where the switch array layer includes an active layer; and forming an organic light-emitting display layer on the switch array layer, a portion of the flexible substrate that is not covered by the switch array layer, and the edge area of the glass substrate, and removing a portion of the organic light-emitting display layer on the metal wire and the edge area such that the edge area of the glass substrate is free from any thin film layers.

The present disclosure also provides a manufacturing method of a display panel, including:

forming a flexible substrate on a display area and a welding area of a glass substrate, where the glass substrate includes the display area, the welding area, and an edge area;

forming a switch array layer on the flexible substrate and the edge area of the glass substrate, and patterning the switch array layer, such that the switch array layer corresponding to the display area serves as a switching element, and the switch array layer corresponding to the welding area serves as a metal wire, and a portion of the switch array layer on the edge area is removed; and forming an organic light-emitting display layer on the switch array layer, a portion of the flexible substrate that is not covered by the switch array layer, and the edge area of the glass substrate, and removing a portion of the organic light-emitting display layer on the metal wire and the edge area.

The present disclosure also provides a display panel, including:

a glass substrate, a switch array layer, an organic light-emitting display layer, and a metal wire, where the glass substrate includes a display area, a welding area, and an edge area, and the welding area is disposed between the display area and the edge area, and the switch array layer and the organic light-emitting display layer are disposed on the display area of the glass substrate, and the metal wire is disposed on the welding area of the glass substrate, and the edge area of the glass substrate is free from any thin film layers.

In the display panel and the manufacturing method thereof of the present disclosure, the thin film layer on the edge area of the glass substrate is removed. Therefore, the flexible substrate and the metal layer are prevented from being formed into conductive particles during a cutting process, thereby preventing the metal wire on the welding area from being short-circuited.

DETAILED DESCRIPTION

The following description of the embodiments with reference to the accompanying drawings is used to illustrate particular embodiments of the present disclosure. The directional terms referred in the present disclosure, such as "upper", "lower", "front", "after", "left", "right", "inner", "outer", "side surface", etc. are only directions with regard to the accompanying drawings. Therefore, the directional terms used for describing and illustrating the present disclosure are not intended to limit the present disclosure. In the drawings, units with similar structures are indicated by the same reference number.

Referring to FIG. 3 to FIG. 9, FIG. 3 is a schematic structural diagram showing a display panel in a first sub-step and a second sub-step of a second step of a manufacturing method of the present disclosure.

Figure 3:
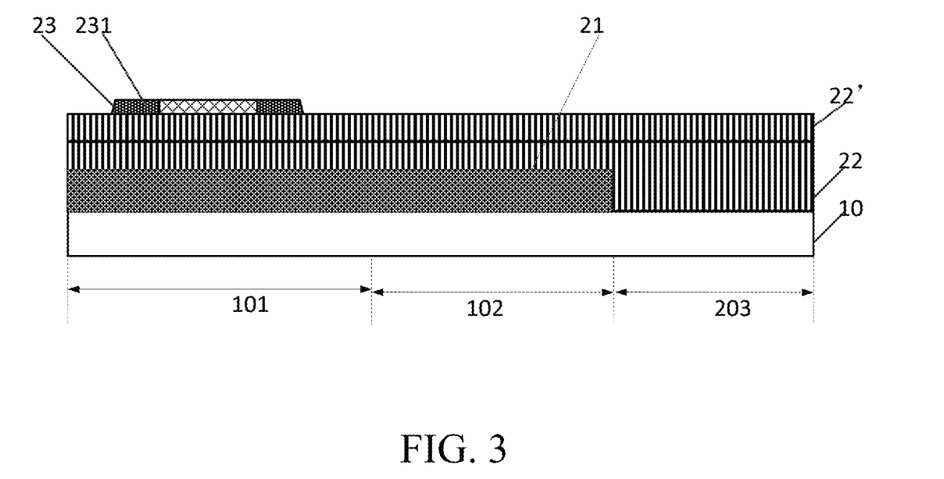
FIG. 3 is a schematic structural diagram showing a display panel in a first sub-step and a second sub-step of a second step of a manufacturing method of the present disclosure.

As shown in FIG. 3, the manufacturing method of the display panel of the present disclosure mainly includes the following steps.

In a step S101, a flexible substrate is formed on a display area and a welding area of a glass substrate.

For example, as shown in FIG. 3, the glass substrate 10 includes the display area 101, the welding area 102, and an edge area 203. The flexible substrate 21 is formed only on the display area 101 and the welding area 102 of the glass substrate.

In an embodiment, in the step S101, that is, the step of forming the flexible substrate on the display area and the welding area of the glass substrate, the method includes:

In a step S1011, the flexible substrate is formed on a whole surface of the glass substrate.

In a step S1012, another portion of the flexible substrate on the edge area of the glass substrate is removed.

For example, the flexible substrate 21 is formed on the whole surface of the glass substrate 10, and then the flexible substrate 21 on the edge area 203 of the glass substrate is stripping off by exposure and etching. In an embodiment, material of the flexible substrate 21 includes polyimide.

In another embodiment, in the step S101, that is, the step of forming the flexible substrate on the display area and the welding area of the glass substrate, the method includes:

In a step S1013, the flexible substrate is formed on the display area and the welding area of the glass substrate.

For example, polyimides (PIs) are coated on the display area 101 and the welding area 102 of the glass substrate 10, and the edge area 203 of the substrate 10 is not coated with polyimides.

In a step S102, a switch array layer is formed on the flexible substrate and the edge area of the glass substrate, and the switch array layer is patterned, such that the switch array layer corresponding to the display area serves as a switching element, and the switch array layer corresponding to the welding area serves as a metal wire, and a portion of the switch array layer on the edge area is removed.

The switch array layer includes an active layer 23, and in steps of forming the switch array layer on the flexible substrate and the edge area of the glass substrate, and patterning the switch array layer, such that the switch array layer corresponding to the display area serves as the switching element, and the switch array layer corresponding to the welding area serves as the metal wire, and the portion of the switch array layer on the edge area is removed, the method further includes:

In a step S102, the active layer is formed on the flexible substrate and the edge area of the glass substrate.

For example, as shown in FIG. 3, in one embodiment, a first inorganic layer 21, a second inorganic layer 22', and an active layer 23 are sequentially formed a whole surface of on the flexible substrate 21 and the edge area of the glass substrate 10. It can be understood that an inorganic layer may be disposed between the flexible substrate 21 and the active layer 23 or no inorganic layers may be disposed between the flexible substrate 21 and the active layer 23.

In a step S102, the active layer is patterned, such that the active layer corresponding to the display area forms a channel pattern, and a portion of the active layer on the edge area is removed.

For example, the active layer 23 is patterned, such that the active layer 23 corresponding to the display area 101 serves as the channel pattern 231, and a portion of the active layer on the edge area 203 of the glass substrate 10 is removed. It can be understood that, after this step, the channel pattern corresponding to the display area remains, and the rest is removed.

The switch array layer further includes a first metal layer, and after a step of patterning the active layer, such that the active layer corresponding to the display area forms the channel pattern, and the portion of the active layer on the edge area is removed, the method further includes:

In a step S1023, a first insulating layer is formed on the channel pattern, another portion of the flexible substrate that is not covered by the channel pattern, and the edge area of the glass substrate.

Figure 4:
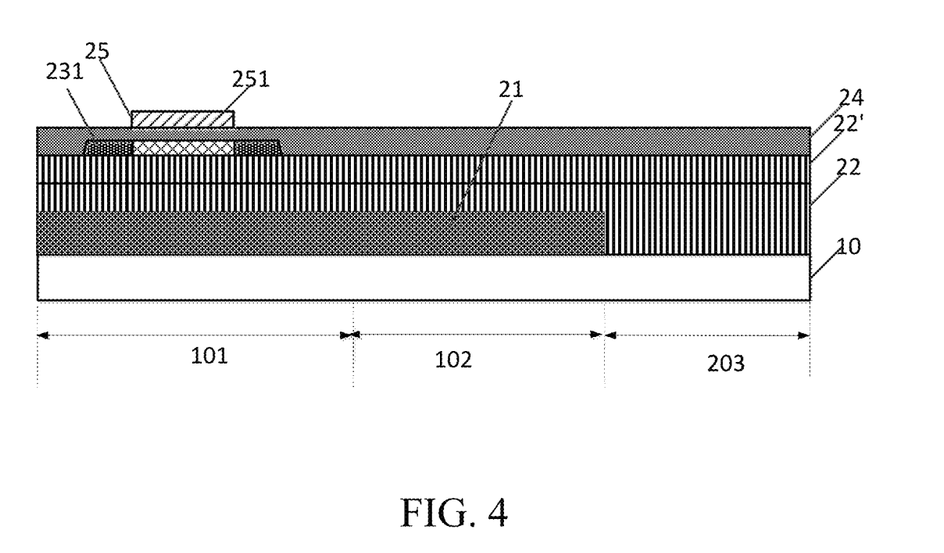
FIG. 4 is a schematic structural diagram showing the display panel in a third sub-step to a fifth sub-step of the second step of the manufacturing method of the present disclosure.

For example, as shown in FIG. 4, the first insulating layer 24 is formed on the channel pattern 231 and a portion of the second inorganic layer 22' that is not covered by the channel pattern 231.

In a step S1024, the first metal layer is formed on the first insulating layer.

For example, the first metal layer 25 is formed on a whole surface of the first insulating layer 24.

In a step S1025, the first metal layer is patterned, such that the first metal layer corresponding to the display area serves as a gate, and a portion of the first metal layer on the edge area is removed.

For example, the first metal layer 25 is patterned to remove the first metal layer corresponding to the edge area 203 while the first metal layer 25 corresponding to the display area 101 forms the gate 251.

The switch array layer further includes a second metal layer 27, and after a step of patterning the first metal layer, such that the first metal layer corresponding to the display area serves as the gate, and the portion of the first metal layer on the edge area is removed, the method further includes:

In a step S1026, a second insulating layer is formed on the gate and a portion of the first insulating layer that is not covered by the gate.

Figure 5:
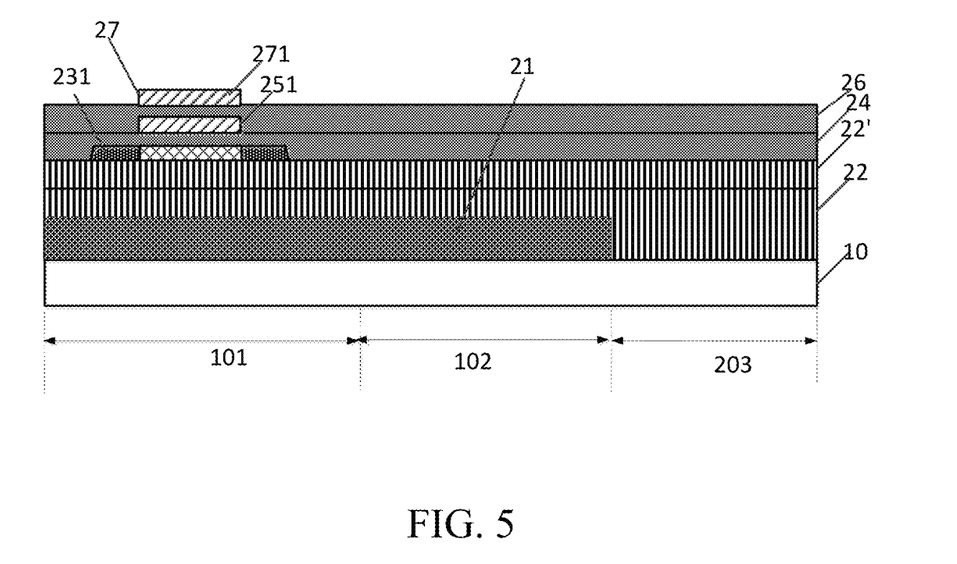
FIG. 5 is a schematic structural diagram showing the display panel in a sixth sub-step to an eighth sub-step of the second step of the manufacturing method of the present disclosure.

For example, as shown in FIG. 5, the second insulating layer 26 is formed on the gate 251 and a portion of the first insulating layer 24 that is not covered by the gate 251.

In a step S1027, the second metal layer is formed on the second insulating layer.

For example, the second metal layer 27 is formed on a whole surface of the second insulating layer 26.

In a step S1028, the second metal layer is patterned, such that the second metal layer corresponding to the display area forms a metal portion, and a portion of the second metal layer corresponding to the edge area is removed.

For example, the second metal layer 27 is patterned, such that the second metal layer 27 corresponding to the display area 101 forms a metal portion 271, and a portion of the second metal layer corresponding to the edge area 203 is removed.

The switch array layer further includes a third insulating layer 28, and after a step of patterning the second metal layer, such that the second metal layer corresponding to the display area forms the metal portion, and the portion of the second metal layer corresponding to the edge area is removed, the method further includes:

In a step S1029, the third insulating layer is formed on the metal portion and a portion of the second insulating layer that is not covered by the metal portion.

Figure 6:
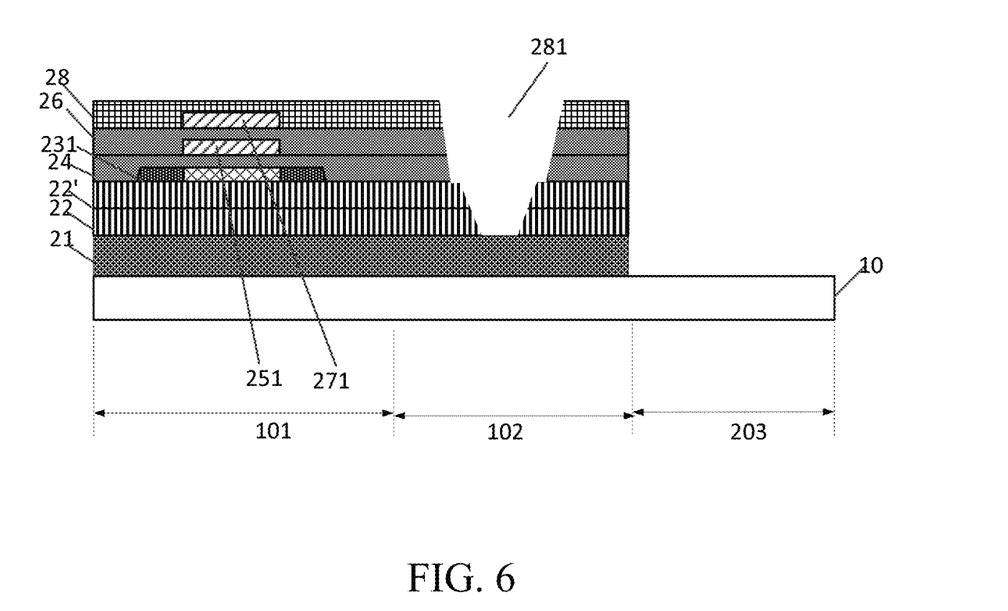
FIG. 6 is a schematic structural diagram showing the display panel in a ninth sub-step to a tenth sub-step of the second step of the manufacturing method of the present disclosure.

For example, as shown in FIG. 6, a third insulating layer 28 is formed on a whole surface of the metal portion 271 and a portion of the second insulating layer 26 that is not covered by the metal portion 271.

In a step S1030, the third insulating layer is patterned, such that a buffer hole is formed on the third insulating layer corresponding to the welding area, and the third insulating layer corresponding to the edge area is removed.

Figure 7:
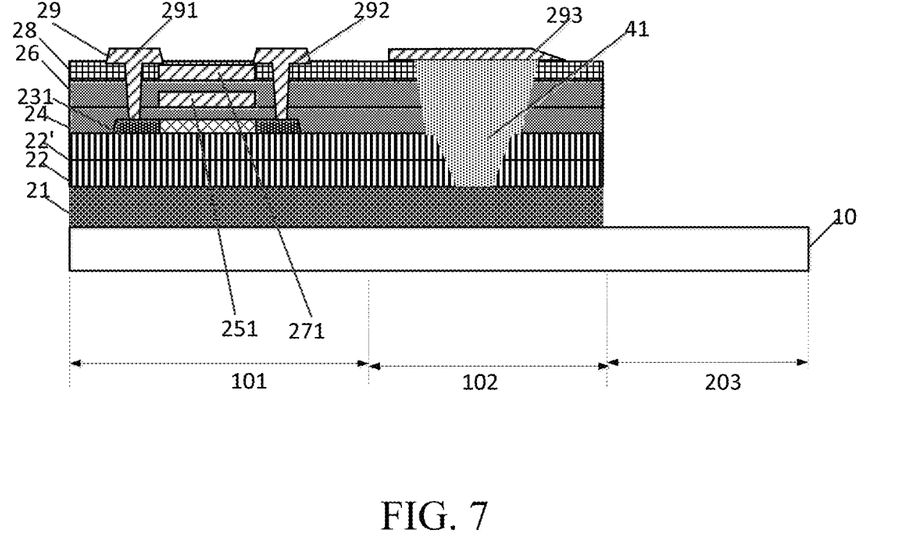
FIG. 7 is a schematic structural diagram showing the display panel in an eleventh sub-step to a twelfth sub-step of the second step of the manufacturing method of the present disclosure.

For example, the third insulating layer 28 is patterned, such that a buffer hole 281 is formed on the third insulating layer 28 corresponding to the welding area 102, and the third insulating layer 28 corresponding to the edge area 203 is removed. Furthermore, the first inorganic layer 22, the second inorganic layer 22', the first insulating layer 24, and the second insulating layer 26 corresponding to the edge area 203 are removed, such that no film layer is formed on the edge area 203 of the glass substrate. In addition, while the third insulating layer 28 is patterned, a source hole, and a drain hole are formed on the third insulating layer 28 corresponding to the display area 101. As shown in FIG. 7, apparently, a buffer material 41 may also be filled in the buffer hole 281

The switch array layer further includes a third metal layer 29, and after a step of patterning the third insulating layer, such that the buffer hole is formed on the third insulating layer corresponding to the welding area, and the portion of the third insulating layer corresponding to the edge area is removed, the method further includes:

In a step S1031, the third metal layer is formed on the third insulating layer and the edge area of the glass substrate.

For example, as shown in FIG. 7, a third metal layer 29 is formed on the third insulating layer 28, the source hole, the drain hole, the buffer material 41, and the edge area 203 of the glass substrate 10.

In a step S1032, the third metal layer is patterned, such that the third metal layer corresponding to the display area servers as a source and a drain, and the metal wire is formed on the buffer hole, and a portion of the third metal layer on the edge area is removed.

For example, as shown in FIG. 7, the third metal layer 29 is patterned, such that the third metal layer 29 corresponding to the display area 101 servers as a source 291 and a drain 292, and the metal wire 293 is formed on the buffer hole, and a portion of the third metal layer on the edge area is removed.

In a step S103, an organic light-emitting display layer is formed on the switch array layer, a portion of the flexible substrate that is not covered by the switch array layer, and the edge area of the glass substrate, and a portion of the organic light-emitting display layer on the metal wire and the edge area is removed.

The organic light-emitting display layer includes a plurality of organic light-emitting units, and a cross-sectional structure thereof includes an anode, an organic light-emitting layer, and a cathode. After a step of forming the organic light-emitting display layer on the switch array layer, the portion of the flexible substrate that is not covered by the switch array layer, and the edge area of the glass substrate, and removing the portion of the organic light-emitting display layer on the metal wire and the edge area, the method further includes:

In a step S201, a planarization layer is formed on the source, the drain, the metal wire, another portion of the third insulating layer that is not covered by the source, the drain, and the metal wire, and the edge area of the glass substrate.

Figure 8:
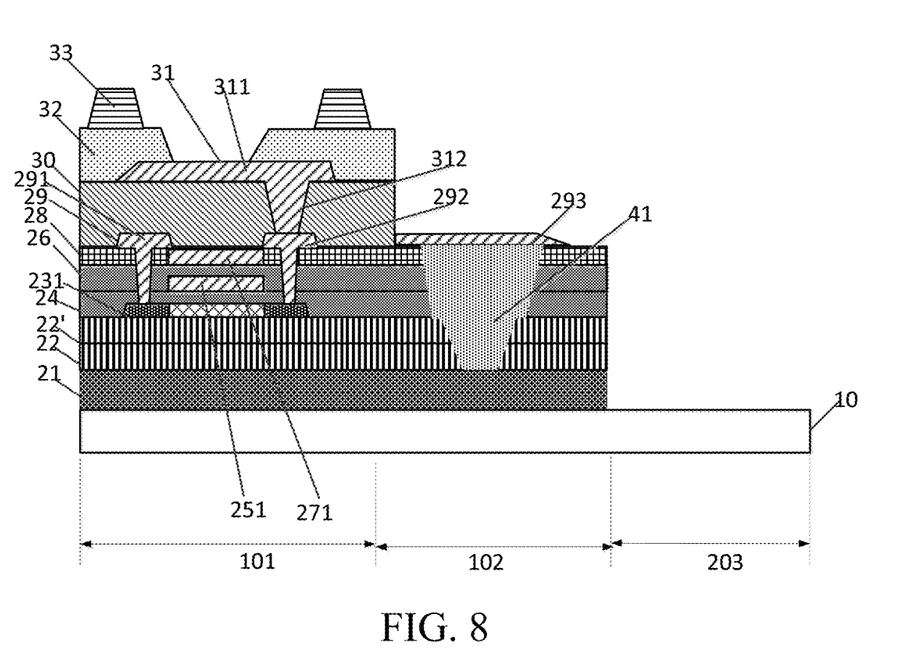
FIG. 8 is a schematic structural diagram showing the display panel in a third step of the manufacturing method the present disclosure.

For example, as shown in FIG. 8, a planarization layer 30 is formed on a whole surface of the source 291, the drain 292, the metal wire 293, another portion of the third insulating layer 28 that is not covered by the source 291, the drain 292, and the metal wire 293, and the edge area 203 of the glass substrate 10.

In a step S202, the planarization layer is patterned, such that a connecting hole is formed, and a portion of the planarization layer on the metal wire and another portion of the planarization layer on the edge area of the glass substrate are removed.

For example, as shown in FIG. 8, the planarization layer 30 is patterned, such that a connecting hole 312 is formed, and a portion of the planarization layer on the metal wire 293 and another portion of the planarization layer on the edge area 203 of the glass substrate 10 are removed.

In a step S203, a conductive layer is formed on the planarization layer, the metal wire, and the edge area of the glass substrate.

For example, as shown in FIG. 8, a conductive layer 31 is formed on the planarization layer 30, the metal wire 293, and the edge area 203 of the glass substrate 10.

In a step S204, the conductive layer is patterned, such that the conductive layer corresponding to the display area servers as the anode, and a portion of the conductive layer on the edge area is removed.

For example, the conductive layer 31 is patterned, such that the conductive layer 31 corresponding to the display area 101 servers as the anode 311, and a portion of the conductive layer 31 on the edge area 203 is removed. Of course, the conductive layer on the metal wire 293 is also removed, that is, after this step, only the anode of the conductive layer is reserved, and the rest is removed.

In a step S205, a pixel definition layer is formed on the anode, another portion of the planarization layer that is not covered by the anode, and the edge area of the glass substrate. The pixel definition layer is patterned, such that the pixel definition layer corresponding to the display area forms pixel definition patterns, and a portion of the pixel definition layer on the edge area is removed.

For example, as shown in FIG. 8, a pixel definition layer 32 is formed on the anode 31, another portion of the planarization layer 30 that is not covered by the anode 31, the metal wire 293, and the edge area 203 of the glass substrate 10.

The pixel definition layer 32 is patterned, such that the pixel definition layer 32 corresponding to the display area 101 forms a plurality of pixel definition patterns, and a portion of the pixel definition layer on the edge area 203 is removed. Also, the pixel definition layer on the metal wire 293 is removed. Two adjacent pixel definition patterns are spaced apart from each other.

The organic light-emitting layer (not shown in the drawings) and the cathode (not shown in the drawings) are sequentially formed between the pixel definition layer patterns.

The method further includes: forming a spacer 33 on the pixel definition layer, and then forming an encapsulation layer at a top of the display area of the display panel to complete the production of the display panel. The organic light-emitting layer and the encapsulation layer are formed by a mask process, such that the edge area 203 is not evaporated for forming the organic light-emitting layer and the encapsulation layer during the fabrication process.

Figure 9:
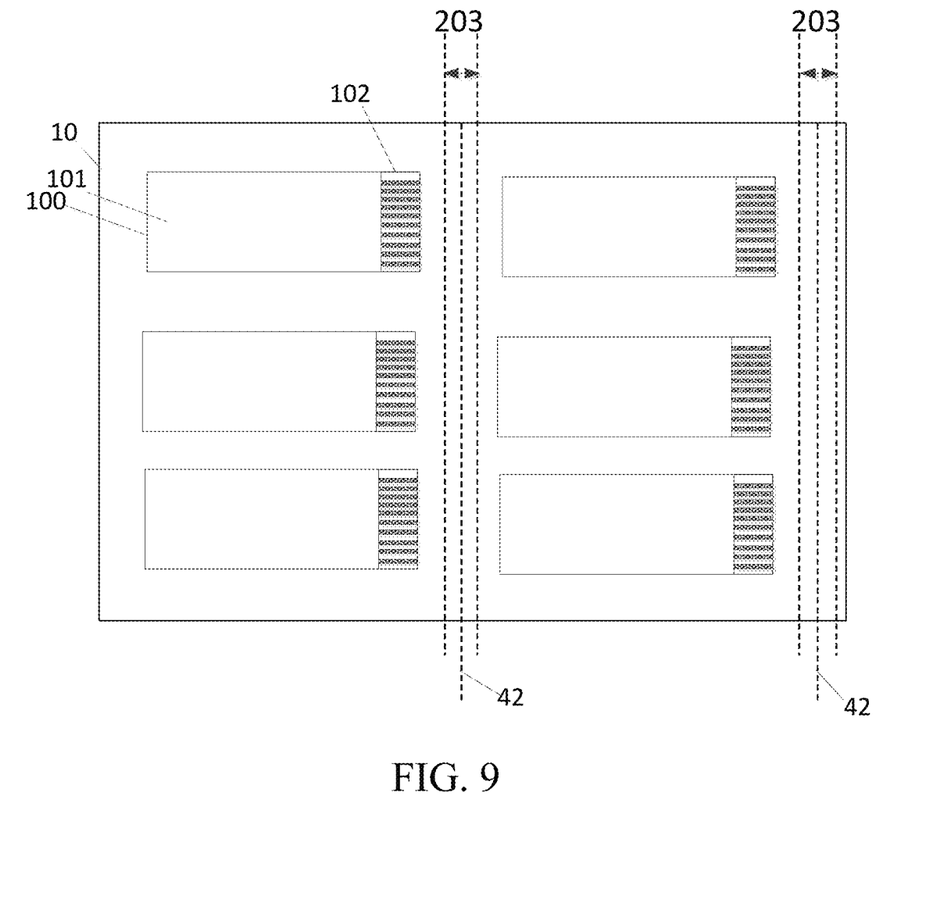
FIG. 9 is a top view of the display panel during a cutting process.

After the display panel is formed, laser cutting is performed. As shown in FIG. 9, a plurality of display panels 100 are formed on the glass substrate 10. The glass substrate includes a plurality of display areas 101, a plurality of welding areas 102, and a plurality of edge areas 203. The glass substrate of the edge areas 203 is cut along a cutting line 42. The cutting line 42 is used to cut the edge areas 203. It can be understood that FIG. 9 only takes two cutting lines 42 as an example, and a number of cutting lines in an actual manufacturing process is not limited to two.

Since no film layer is disposed on the edge areas of the glass substrate of the display panels of the present disclosure, the flexible substrate and the metal layer are not formed into conductive particles during the cutting process, thereby preventing the metal wire on the welding area from being short-circuited.

As shown in FIG. 8, the present disclosure also provides a display panel, including:

a glass substrate 10, a switch array layer, an organic light-emitting display layer, and a metal wire 293, where the glass substrate 10 includes a display area 101, a welding area 102, and an edge area 203, and the welding area 102 is disposed between the display area 101 and the edge area 203, and the switch array layer and the organic light-emitting display layer are disposed on the display area 101 of the glass substrate 10, and the metal wire 293 is disposed on the welding area 102 of the glass substrate, and the edge area 203 of the glass substrate 10 is free from any thin film layers. The switch array layer includes a plurality of switching elements, and a cross-sectional structure of the switch array layer includes an active layer, a gate, a source, and a drain, and may further include a metal portion. The organic light-emitting display layer includes a plurality of organic light-emitting units, and a cross-sectional structure of the organic light-emitting display layer includes an anode, an organic light-emitting layer, and a cathode. The display panel of the present disclosure is obtained by using the above manufacturing method. For details, please refer to the above, and details are not described herein again.

In the display panel and the manufacturing method thereof of the present disclosure, the thin film layer on the edge area of the glass substrate is removed. Therefore, the flexible substrate and the metal layer are prevented from being formed into conductive particles during a cutting process, thereby preventing the metal wire on the welding area from being short-circuited.

The above descriptions are merely preferable embodiments of the present disclosure, and are not intended to limit the scope of the present disclosure. Any modification or replacement made by those skilled in the art without departing from the spirit and principle of the present disclosure should fall within the protection scope of the present disclosure. Therefore, the protection scope of the present disclosure is subject to the appended claims.

What is claimed is:

1. A manufacturing method of a display panel, comprising:

forming a flexible substrate on a display area and a welding area of a glass substrate, wherein the glass substrate comprises the display area, the welding area, and an edge area;

forming a switch array layer on the flexible substrate and the edge area of the glass substrate, and patterning the switch array layer, such that the switch array layer corresponding to the display area serves as a switching element, and the switch array layer corresponding to the welding area serves as a metal wire, and a portion of the switch array layer on the edge area is removed, wherein the switch array layer comprises an active layer; and forming an organic light-emitting display layer on the switch array layer, a portion of the flexible substrate that is not covered by the switch array layer, and the edge area of the glass substrate, and removing a portion of the organic light-emitting display layer on the metal wire and the edge area such that the edge area of the glass substrate is free from any thin film layers;

in steps of forming the switch array layer on the flexible substrate and the edge area of the glass substrate, and patterning the switch array layer, such that the switch array layer corresponding to the display area serves as the switching element, and the switch array layer corresponding to the welding area serves as the metal wire, and the portion of the switch array layer on the edge area is removed, comprising:

forming the active layer on the flexible substrate and the edge area of the glass substrate; and patterning the active layer, such that the active layer corresponding to the display area forms a channel pattern, and a portion of the active layer on the edge area is removed;

wherein the switch array layer further comprises a first metal layer, and after a step of patterning the active layer, such that the active layer corresponding to the display area forms the channel pattern, and the portion of the active layer on the edge area is removed, the method further comprises:

forming a first insulating layer on the channel pattern, another portion of the flexible substrate that is not covered by the channel pattern, and the edge area of the glass substrate;

forming the first metal layer on the first insulating layer; and patterning the first metal layer, such that the first metal layer corresponding to the display area serves as a gate, and a portion of the first metal layer on the edge area is removed.

2. The manufacturing method of the display panel as claimed in claim 1, wherein the switch array layer further comprises a second metal layer, and after a step of patterning the first metal layer, such that the first metal layer corresponding to the display area serves as the gate, and the portion of the first metal layer on the edge area is removed, the method further comprises:

forming a second insulating layer on the gate and a portion of the first insulating layer that is not covered by the gate;

forming the second metal layer on the second insulating layer; and patterning the second metal layer, such that the second metal layer corresponding to the display area forms a metal portion, and a portion of the second metal layer corresponding to the edge area is removed.

3. The manufacturing method of the display panel as claimed in claim 2, wherein the switch array layer further comprises a third insulating layer, and after a step of patterning the second metal layer, such that the second metal layer corresponding to the display area forms the metal portion, and the portion of the second metal layer corresponding to the edge area is removed, the method further comprises:

forming the third insulating layer on the metal portion and a portion of the second insulating layer that is not covered by the metal portion; and patterning the third insulating layer, such that a buffer hole is formed on the third insulating layer corresponding to the welding area, and portions of the third insulating layer, the first insulating layer, and the second insulating layer corresponding to the edge area are removed.

4. The manufacturing method of the display panel as claimed in claim 3, wherein the switch array layer further comprises a third metal layer, and after a step of patterning the third insulating layer, such that the buffer hole is formed on the third insulating layer corresponding to the welding area, and a portion of the third insulating layer corresponding to the edge area is removed, the method further comprises:

forming the third metal layer on the third insulating layer and the edge area of the glass substrate; and patterning the third metal layer, such that the third metal layer corresponding to the display area servers as a source and a drain, and the metal wire is formed on the buffer hole, and a portion of the third metal layer on the edge area is removed.

5. The manufacturing method of the display panel as claimed in claim 4, wherein the organic light-emitting display layer further comprises an anode, and after a step of forming the organic light-emitting display layer on the switch array layer, the portion of the flexible substrate that is not covered by the switch array layer, and the edge area of the glass substrate, and removing the portion of the organic light-emitting display layer on the metal wire and the edge area, the method further comprises:

forming a planarization layer on the source, the drain, the metal wire, another portion of the third insulating layer that is not covered by the source, the drain, and the metal wire, and the edge area of the glass substrate;

patterning the planarization layer, such that a connecting hole is formed, and a portion of the planarization layer on the metal wire and another portion of the planarization layer on the edge area of the glass substrate are removed;

forming a conductive layer on the planarization layer, the metal wire, and the edge area of the glass substrate; and patterning the conductive layer, such that the conductive layer corresponding to the display area servers as the anode, and a portion of the conductive layer on the edge area is removed.

6. The manufacturing method of the display panel as claimed in claim 5, after a step of patterning the conductive layer, such that the conductive layer corresponding to the display area servers as the anode, and the portion of the conductive layer on the edge area is removed, the method further comprising:

forming a pixel definition layer on the anode, another portion of the planarization layer that is not covered by the anode, and the edge area of the glass substrate;

patterning the pixel definition layer, such that the pixel definition layer corresponding to the display area forms pixel definition patterns, and a portion of the pixel definition layer on the edge area is removed; and forming an organic light-emitting layer and a cathode between the pixel definition patterns.

7. The manufacturing method of the display panel as claimed in claim 1, in a step of forming the flexible substrate on the display area and the welding area of the glass substrate, comprising:

forming the flexible substrate on a whole surface of the glass substrate; and removing another portion of the flexible substrate on the edge area of the glass substrate.

8. A manufacturing method of a display panel, comprising:

forming a flexible substrate on a display area and a welding area of a glass substrate, wherein the glass substrate comprises the display area, the welding area, and an edge area;

forming a switch array layer on the flexible substrate and the edge area of the glass substrate, and patterning the switch array layer, such that the switch array layer corresponding to the display area serves as a switching element, and the switch array layer corresponding to the welding area serves as a metal wire, and a portion of the switch array layer on the edge area is removed; and forming an organic light-emitting display layer on the switch array layer, a portion of the flexible substrate that is not covered by the switch array layer, and the edge area of the glass substrate, and removing a portion of the organic light-emitting display layer on the metal wire and the edge area;

wherein the switch array layer comprises an active layer, and in steps of forming the switch array layer on the flexible substrate and the edge area of the glass substrate, and patterning the switch array layer, such that the switch array layer corresponding to the display area serves as the switching element, and the switch array layer corresponding to the welding area serves as the metal wire, and the portion of the switch array layer on the edge area is removed, the method further comprises:

forming the active layer on the flexible substrate and the edge area of the glass substrate; and patterning the active layer, such that the active layer corresponding to the display area forms a channel pattern, and a portion of the active layer on the edge area is removed;

wherein the switch array layer further comprises a first metal layer, and after a step of patterning the active layer, such that the active layer corresponding to the display area forms the channel pattern, and the portion of the active layer on the edge area is removed, the method further comprises:

forming a first insulating layer on the channel pattern, another portion of the flexible substrate that is not covered by the channel pattern, and the edge area of the glass substrate;

forming the first metal layer on the first insulating layer; and patterning the first metal layer, such that the first metal layer corresponding to the display area serves as a gate, and a portion of the first metal layer on the edge area is removed.

9. The manufacturing method of the display panel as claimed in claim 8, wherein the switch array layer further comprises a second metal layer, and after a step of patterning the first metal layer, such that the first metal layer corresponding to the display area serves as the gate, and the portion of the first metal layer on the edge area is removed, the method further comprises:

forming a second insulating layer on the gate and a portion of the first insulating layer that is not covered by the gate;

forming the second metal layer on the second insulating layer; and     patterning the second metal layer, such that the second metal layer corresponding to the display area forms a metal portion, and a portion of the second metal layer corresponding to the edge area is removed.

10. The manufacturing method of the display panel as claimed in claim 9, wherein the switch array layer further comprises a third insulating layer, and after a step of patterning the second metal layer, such that the second metal layer corresponding to the display area forms the metal portion, and the portion of the second metal layer corresponding to the edge area is removed, the method further comprises:

forming the third insulating layer on the metal portion and a portion of the second insulating layer that is not covered by the metal portion; and     patterning the third insulating layer, such that a buffer hole is formed on the third insulating layer corresponding to the welding area, and portions of the third insulating layer, the first insulating layer, and the second insulating layer corresponding to the edge area are removed.

11. The manufacturing method of the display panel as claimed in claim 10, wherein the switch array layer further comprises a third metal layer, and after a step of patterning the third insulating layer, such that the buffer hole is formed on the third insulating layer corresponding to the welding area, and a portion of the third insulating layer corresponding to the edge area is removed, the method further comprises:

forming the third metal layer on the third insulating layer and the edge area of the glass substrate; and     patterning the third metal layer, such that the third metal layer corresponding to the display area servers as a source and a drain, and the metal wire is formed on the buffer hole, and a portion of the third metal layer on the edge area is removed.

12. The manufacturing method of the display panel as claimed in claim 11, wherein the organic light-emitting display layer further comprises an anode, and after a step of forming the organic light-emitting display layer on the switch array layer, the portion of the flexible substrate that is not covered by the switch array layer, and the edge area of the glass substrate, and removing the portion of the organic light-emitting display layer on the metal wire and the edge area, the method further comprises:

forming a planarization layer on the source, the drain, the metal wire, another portion of the third insulating layer that is not covered by the source, the drain, and the metal wire, and the edge area of the glass substrate;

patterning the planarization layer, such that a connecting hole is formed, and a portion of the planarization layer on the metal wire and another portion of the planarization layer on the edge area of the glass substrate are removed;

forming a conductive layer on the planarization layer, the metal wire, and the edge area of the glass substrate; and     patterning the conductive layer, such that the conductive layer corresponding to the display area servers as the anode, and a portion of the conductive layer on the edge area is removed.

13. The manufacturing method of the display panel as claimed in claim 8, in a step of forming the flexible substrate on the display area and the welding area of the glass substrate, comprising:

forming the flexible substrate on a whole surface of the glass substrate; and     removing another portion of the flexible substrate on the edge area of the glass substrate.

\* \* \* \* \*